(12) United States Patent
Yorita

(10) Patent No.: US 10,401,898 B2
(45) Date of Patent: Sep. 3, 2019

(54) SIGNAL PROCESSING CIRCUIT

(71) Applicant: NIHON DEMPA KOGYO CO., LTD., Tokyo (JP)

(72) Inventor: Tomoya Yorita, Saitama (JP)

(73) Assignee: NIHON DEMPA KOGYO CO., LTD., Tokyo (JP)

( * ) Notice: Subject to any disclaimer, the term of this patent is extended or adjusted under 35 U.S.C. 154(b) by 0 days.

(21) Appl. No.: 16/215,656

(22) Filed: Dec. 11, 2018

(65) Prior Publication Data

US 2019/0179360 A1    Jun. 13, 2019

(30) Foreign Application Priority Data

Dec. 13, 2017    (JP) .................................. 2017-238657

(51) Int. Cl.
*G06F 1/06*       (2006.01)
(52) U.S. Cl.
CPC ....................................... *G06F 1/06* (2013.01)
(58) Field of Classification Search
CPC ....................................................... G06F 1/06
See application file for complete search history.

(56) References Cited

U.S. PATENT DOCUMENTS

| 6,759,886 B2 * | 7/2004 | Nakanishi | ................. G06F 1/06 327/115 |
| 2018/0076818 A1 * | 3/2018 | Yorita | .................... H03K 21/10 |

FOREIGN PATENT DOCUMENTS

JP    2003037485    2/2003

* cited by examiner

*Primary Examiner* — Patrick O Neill
(74) *Attorney, Agent, or Firm* — JCIPRNET

(57) ABSTRACT

A signal processing circuit includes a clock generating circuit, a divider circuit, a converter, and an amplifier. The clock generating circuit outputs a first clock. The divider circuit divides the first clock to output a second clock having a frequency lower than a frequency of the first clock. The converter converts an input signal into a digital signal based on a first clock output from the clock generating circuit and a second clock output from the divider circuit. The amplifier, disposed between the clock generating circuit and the divider circuit, has a phase variation property opposite to a phase variation property of the divider circuit. The phase variation property of the divider circuit indicates a relationship between a phase variation amount of an output signal with respect to an input signal in the divider circuit and an ambient temperature of the divider circuit.

3 Claims, 4 Drawing Sheets

1

SIGNAL PROCESSING CIRCUIT

CROSS-REFERENCE TO RELATED APPLICATIONS

This application is based on and claims priority under 35 U.S.C. § 119 to Japanese Patent Application No. 2017-238657, filed on Dec. 13, 2017, the entire content of which is incorporated herein by reference.

TECHNICAL FIELD

This disclosure relates to a signal processing circuit.

DESCRIPTION OF THE RELATED ART

There has been conventionally known a clock generating circuit that generates a first clock and a second clock having a frequency lower than that of the first clock (for example, see Japanese Unexamined Patent Application Publication No. 2003-37485). The clock generating circuit outputs the generated first clock and second clock to a signal processing device such as an AD converter that performs predetermined signal processing.

The second clock is, for example, generated by the clock generating circuit based on the first clock. A change in temperature around the clock generating circuit changes a property of a component provided with the clock generating circuit and varies a change timing of the second clock with respect to a change timing of the first clock. Consequently, this has caused a problem that a synchronization condition between the first clock and the second clock required at the signal processing device is not met in some cases.

A need thus exists for a signal processing circuit which is not susceptible to the drawback mentioned above.

SUMMARY

According to a first aspect of this disclosure, there is provided a signal processing circuit that includes a clock generating circuit, a divider circuit, a converter, and an amplifier. The clock generating circuit is configured to output a first clock. The divider circuit is configured to divide the first clock to output a second clock. The second clock has a frequency lower than a frequency of the first clock. The converter is configured to convert an input signal into a digital signal based on a first clock output from the clock generating circuit and a second clock output from the divider circuit. The amplifier is disposed between the clock generating circuit and the divider circuit. The amplifier has a phase variation property opposite to a phase variation property of the divider circuit. The phase variation property of the divider circuit indicates a relationship between a phase variation amount of an output signal with respect to an input signal in the divider circuit and an ambient temperature of the divider circuit.

BRIEF DESCRIPTION OF THE DRAWINGS

The foregoing and additional features and characteristics of this disclosure will become more apparent from the following detailed description considered with reference to the accompanying drawings, wherein.

DETAILED DESCRIPTION

Configuration of Signal Processing Circuit 1 According to First Embodiment

Figure 1:
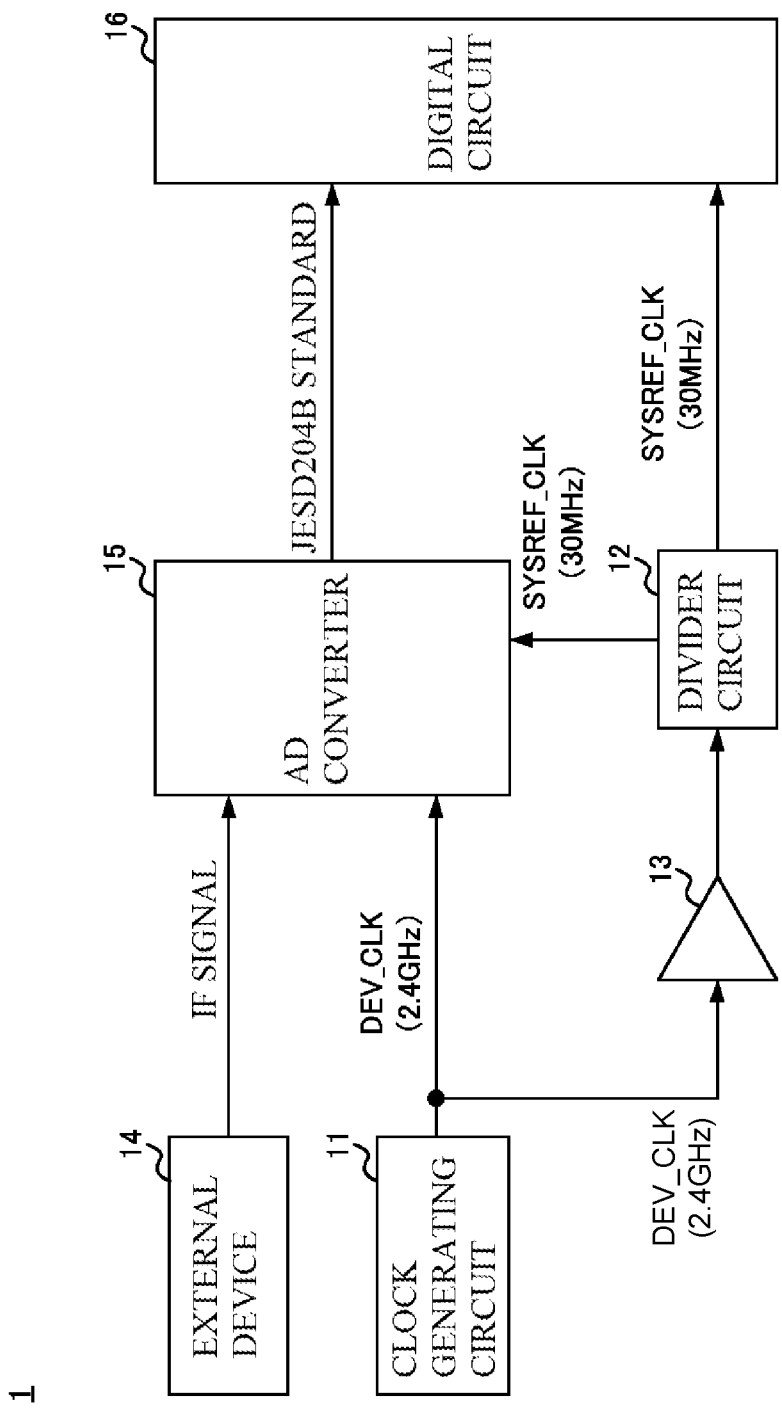
FIG. 1 is a drawing illustrating a configuration of a signal processing circuit according to a first embodiment.

FIG. 1 is a drawing illustrating a configuration of a signal processing circuit 1 according to a first embodiment. The signal processing circuit 1 includes a clock generating circuit 11, a divider circuit 12, an amplifier 13, an external device 14, an AD converter 15, and a digital circuit 16.

The clock generating circuit 11 generates a first clock DEV_CLK. The first clock has a frequency of, for example, 2.4 GHz. The clock generating circuit 11 outputs the generated first clock to the amplifier 13 and the AD converter 15.

The divider circuit 12 is connected to the clock generating circuit 11 via the amplifier 13. The divider circuit 12 divides the first clock output from the clock generating circuit 11 at a predetermined division ratio to generate a second clock SYSREF_CLK having a frequency lower than that of the first clock. The second clock has a frequency of 30 MHz. The divider circuit 12 outputs the generated second clock to the AD converter 15 and the digital circuit 16.

An output signal delays compared with an input signal in an electronic circuit. In this description, a delay period of the output signal with respect to the input signal is referred to as a phase variation amount. The phase variation amount of the output signal with respect to the input signal changes depending on a temperature. In this description, a relationship between the temperature and the phase variation amount is referred to as a phase variation property.

Figure 2:
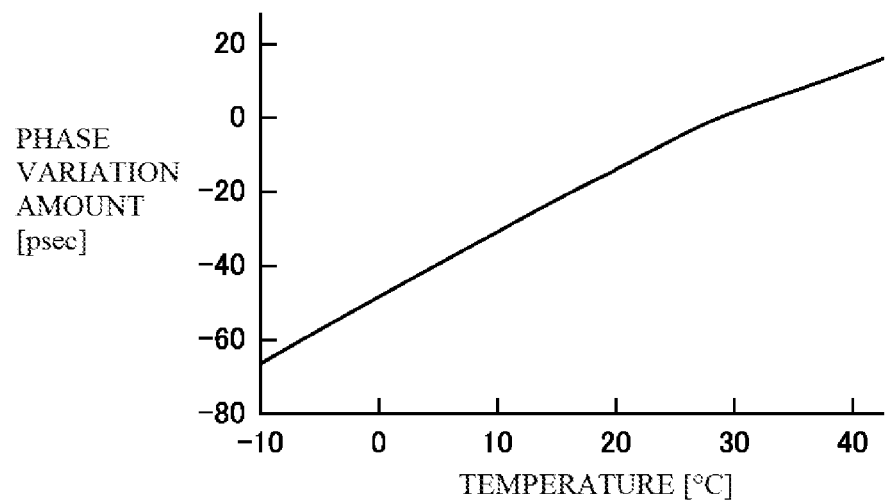
FIG. 2 is a drawing illustrating a phase variation property of a divider circuit according to the first embodiment.

The phase variation property of the divider circuit 12 indicates a relationship between the phase variation amount of the output signal with respect to the input signal in the divider circuit 12 and the ambient temperature of the divider circuit 12. FIG. 2 is a drawing illustrating the phase variation property of the divider circuit 12 according to the first embodiment. In FIG. 2, the horizontal axis indicates the temperature of the divider circuit 12 and the vertical axis indicates the phase variation amount of the output signal with respect to the input signal in the divider circuit 12. In the example illustrated in FIG. 2, as the temperature increases by one degree, the phase of the output signal with respect to the phase of the input signal delays about 1.7 psec.

The amplifier 13 is disposed between the clock generating circuit 11 and the divider circuit 12. The amplifier 13 is disposed near the divider circuit 12. The amplifier 13 amplifies a signal level of the first clock output from the clock generating circuit 11 and input to the divider circuit 12. The amplifier 13 outputs the first clock with the signal level amplified to the divider circuit 12.

The amplifier 13 has a phase variation property opposite to the phase variation property of the divider circuit 12. When the divider circuit 12 has the phase variation property in which the phase variation amount increases as the temperature increases, the opposite phase variation property is the phase variation property in which the phase variation amount decreases as the temperature increases. When the divider circuit 12 has the phase variation property in which the phase variation amount decreases as the temperature increases, the opposite phase variation property is the phase variation property in which the phase variation amount increases as the temperature increases.

Figure 3:
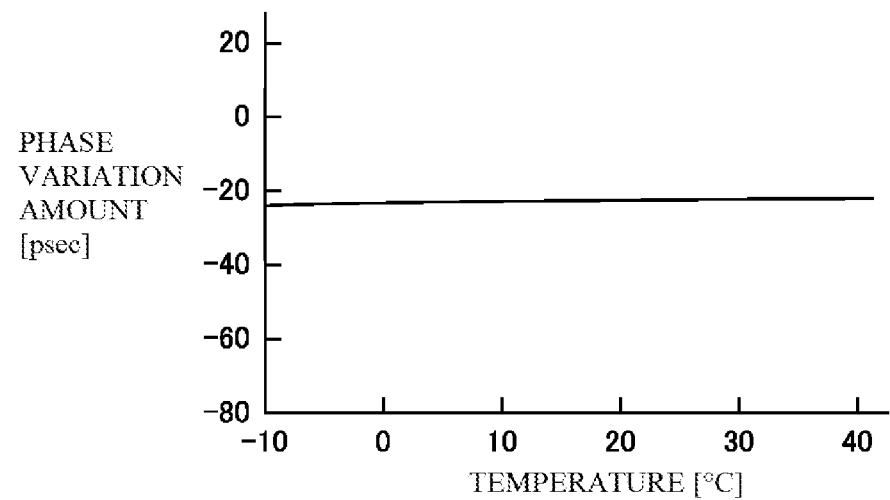
FIG. 3 is a drawing illustrating a relationship between a phase variation amount of an output signal output from the divider circuit with respect to an input signal to an amplifier and an ambient temperature of the divider circuit according to the first embodiment.

FIG. 3 is a drawing illustrating the relationship between the phase variation amount of the output signal output from the divider circuit 12 with respect to the input signal to the amplifier 13 according to the first embodiment and the ambient temperature of the divider circuit 12. As illustrated in FIG. 3, it can be confirmed that canceling the phase variation property of the divider circuit 12 by the phase variation property of the amplifier 13 makes the phase variation amount of the output signal (the second clock) output from the divider circuit 12 with respect to the input signal (the first clock) to the amplifier 13 almost constant regardless of the temperature variation.

The external device 14 is, for example, a communication device and a measurement device that generates an Intermediate Frequency (IF) signal as an analog signal. The external device 14 outputs the generated IF signal to the AD converter 15.

The AD converter 15 converts an analog signal into a digital signal. Specifically, the AD converter 15 converts the IF signal as the input signal input from the external device 14 into the digital signal based on the first clock, which is output from the clock generating circuit 11, and the second clock, which is output from the divider circuit 12. The AD converter 15 outputs the converted digital signal to the digital circuit 16 at a timing based on the standard of JESD204B.

The digital circuit 16 is, for example, a Field Programmable Gate Array (FPGA) that performs various processes based on the digital signal input from the AD converter 15 and the second clock input from the divider circuit 12.

Effects of First Embodiment

As described above, the signal processing circuit 1 according to the first embodiment includes the amplifier 13, which is disposed between the clock generating circuit 11 and the divider circuit 12 and has the phase variation property opposite to the phase variation property of the divider circuit 12. This configuration cancels the phase variation property of the divider circuit 12 by the phase variation property of the amplifier 13 and the phase variation amount of the second clock output from the divider circuit 12 with respect to the first clock input to the amplifier 13 becomes almost constant regardless of the temperature variation. Accordingly, the signal processing circuit 1 can make the phase variation amount between the first clock and the second clock input to the AD converter 15 almost constant regardless of the temperature variation and meet a synchronization condition between the first clock and the second clock regardless of the temperature variation.

While the first embodiment describes the example where the amplifier 13 is disposed between the divider circuit 12 and the clock generating circuit 11, the configuration is not limited to this, and the amplifier 13 may be disposed at another position. For example, two respective amplifiers 13 may be disposed between the divider circuit 12 and the AD converter 15 and between the divider circuit 12 and the digital circuit 16. Alternatively, an amplifier having the phase variation property identical to the phase variation property of the divider circuit 12 may be disposed between a connection point of the clock generating circuit 11 and the divider circuit 12 and the AD converter 15. This configuration allows meeting the synchronization condition between the first clock and the second clock regardless of the temperature variation, similarly to the case of disposing the amplifier 13 between the divider circuit 12 and the clock generating circuit 11.

One Set of Divider Circuit 12 and Amplifier 13 is Provided with Respect to a Plurality of AD Converters 15 of Second Embodiment Next, the following describes the second embodiment. The second embodiment is different from the first embodiment in that the signal processing circuit 1 includes a plurality of AD converters 15 and the one set of the divider circuit 12 and the amplifier 13 for conversion of the IF signals output from the plurality of external devices 14 into the digital signals. The following describes the signal processing circuit 1 according to the second embodiment.

While this embodiment describes an example where the two external devices 14 are disposed and the two AD converters 15 are disposed corresponding to the two external devices 14, the configuration is not limited to this, and each of the external devices 14 and the AD converters 15 may be disposed by three or more. Like reference numerals designate corresponding or identical elements to those of the first embodiment, and therefore such elements will not be further elaborated here.

Figure 4:
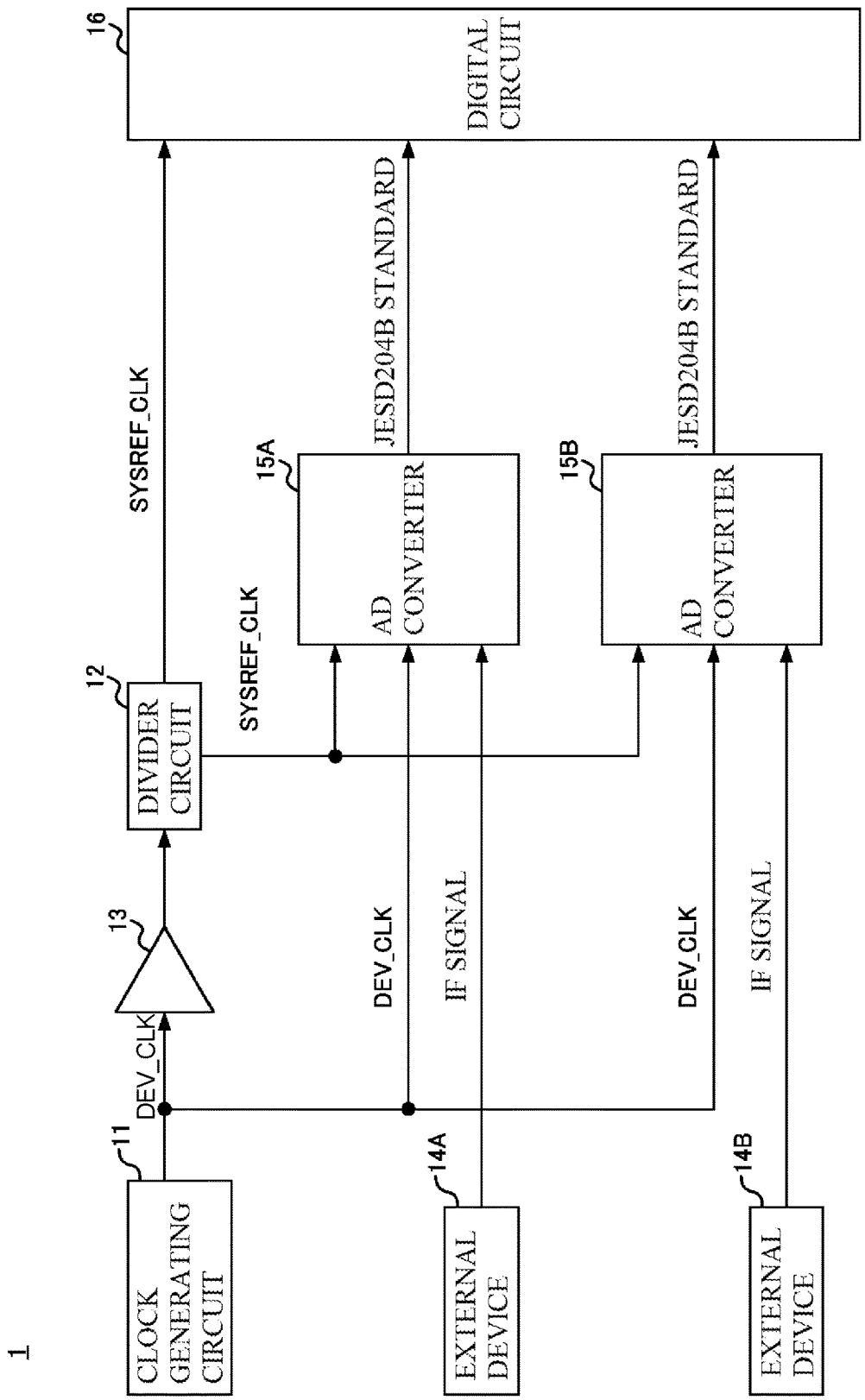
FIG. 4 is a drawing illustrating a configuration of a signal processing circuit according to a second embodiment.

FIG. 4 is a drawing illustrating the configuration of the signal processing circuit 1 according to the second embodiment. As illustrated in FIG. 4, the signal processing circuit 1 according to the second embodiment includes an external device 14A and an external device 14B as the plurality of external devices 14. Additionally, the signal processing circuit 1 includes an AD converter 15A and an AD converter 15B as the plurality of AD converters 15 corresponding to the plurality of respective input signals input from the plurality of external devices 14.

In the second embodiment, the clock generating circuit 11 outputs the generated first clock to the amplifier 13, the AD converter 15A, and the AD converter 15B. The divider circuit 12 outputs the second clock to the plurality of respective AD converters 15 (the AD converter 15A and the AD converter 15B) and the digital circuit 16.

The amplifier 13 is disposed between the clock generating circuit 11 and the divider circuit 12. The amplifier 13 has the phase variation property opposite to the phase variation property of the divider circuit 12.

The external device 14A outputs the generated IF signal to the AD converter 15A. The external device 14B outputs the generated IF signal to the AD converter 15B.

The AD converter 15A converts the IF signal input from the external device 14A into the digital signal based on the first clock output from the clock generating circuit 11 and the second clock output from the divider circuit 12. The AD converter 15A outputs the converted digital signal to the digital circuit 16 at a timing based on the standard of JESD204B.

The AD converter 15B converts the IF signal input from the external device 14B into the digital signal based on the first clock output from the clock generating circuit 11 and the second clock output from the divider circuit 12. The AD converter 15B outputs the converted digital signal to the digital circuit 16 at a timing based on the standard of JESD204B.

Effects of Second Embodiment

As described above, the signal processing circuit 1 according to the second embodiment includes the amplifier 13, which has the phase variation property opposite to the phase variation property of the divider circuit 12 similarly to the first embodiment. The divider circuit 12 outputs the second clock to the plurality of respective AD converters 15. With this configuration, the signal processing circuit 1 according to the second embodiment can make the phase variation amount between the first clock and the second clock input to the plurality of respective AD converter 15 almost constant regardless of the temperature variation and meet a synchronization condition between the first clock and the second clock in the plurality of AD converters 15.

Divider Circuit 12 and Amplifier 13 are Provided with Respect to a Plurality of Respective AD Converters 15 of Third Embodiment Next, the following describes the third embodiment. When the second clock is output from the one divider circuit 12 to the plurality of AD converters 15 like the second embodiment, the second clock contains noise depending on the wiring and this possibly results in a failure of the normal operation of the AD converter 15. Therefore, the signal processing circuit 1 according to the third embodiment includes the divider circuits 12 and the amplifiers 13 to the plurality of respective AD converters 15. The following describes the signal processing circuit 1 according to the third embodiment. Like reference numerals designate corresponding or identical elements to those of the second embodiment, and therefore such elements will not be further elaborated here.

Figure 5:
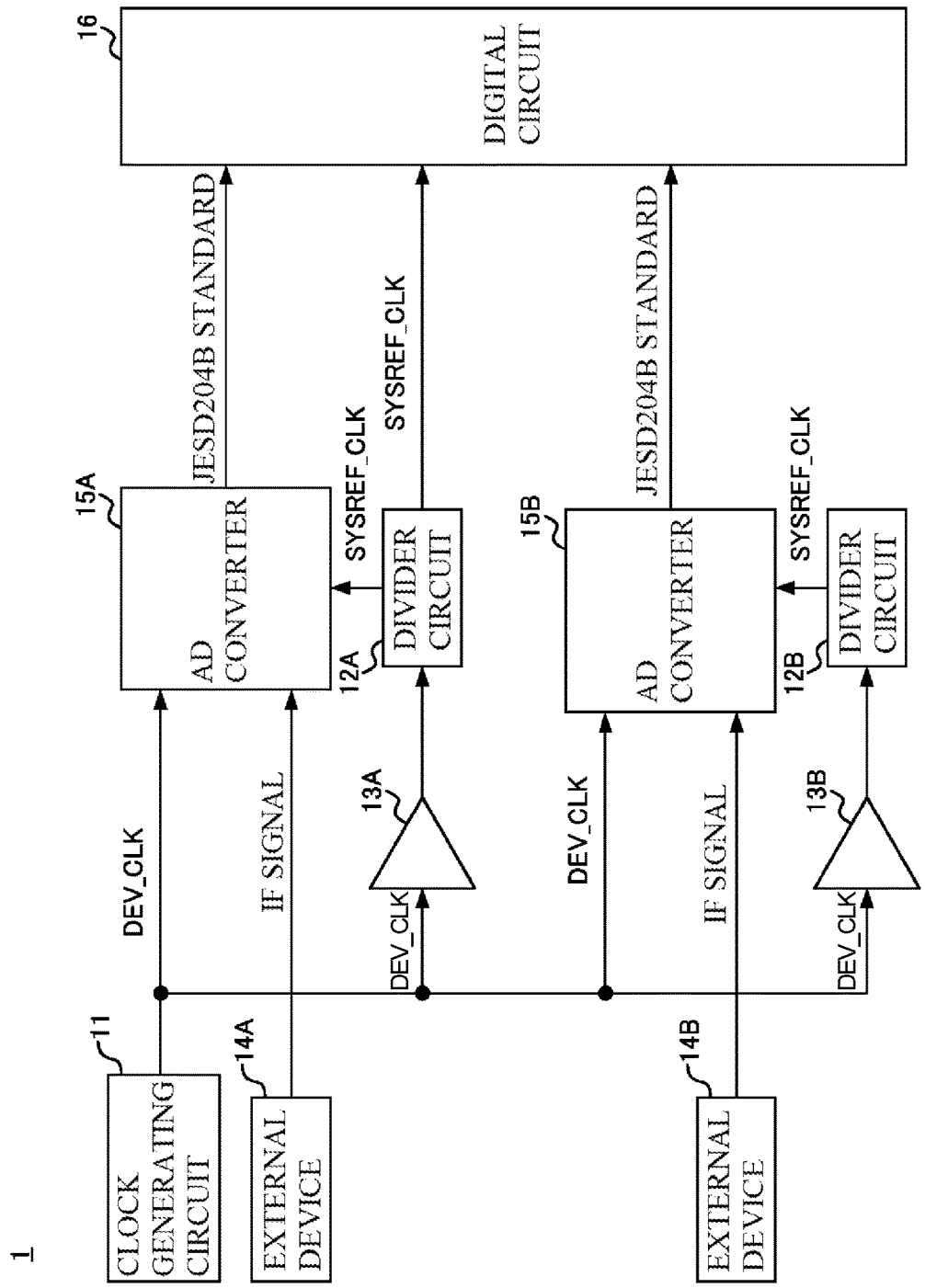
FIG. 5 is a drawing illustrating a configuration of a signal processing circuit according to a third embodiment.

FIG. 5 is a drawing illustrating the configuration of the signal processing circuit 1 according to the third embodiment. As illustrated in FIG. 5, the signal processing circuit 1 includes a divider circuit 12A and a divider circuit 12B as the plurality of divider circuits 12 that generate the second clocks input to the plurality of respective AD converters 15. The signal processing circuit 1 includes an amplifier 13A and an amplifier 13B as the plurality of amplifiers 13 disposed between the clock generating circuit 11 and the plurality of respective divider circuits 12 and having the phase variation property opposite to the phase variation property of these divider circuits 12.

The amplifier 13A is disposed between the clock generating circuit 11 and the divider circuit 12A. The amplifier 13A has the phase variation property opposite to the phase variation property of the divider circuit 12A.

The divider circuit 12A generates the second clock based on the first clock after being amplified output from the amplifier 13A. The divider circuit 12A outputs the generated second clock to the AD converter 15A and the digital circuit 16.

The amplifier 13B is disposed between the clock generating circuit 11 and the divider circuit 12B. The amplifier 13B has the phase variation property opposite to the phase variation property of the divider circuit 12B.

The divider circuit 12B generates the second clock based on the first clock after being amplified output from the amplifier 13B. The divider circuit 12B outputs the generated second clock to the AD converter 15B.

The AD converter 15A converts an IF signal input from the external device 14A into a digital signal based on the first clock output from the clock generating circuit 11 and the second clock output from the divider circuit 12A.

The AD converter 15B converts an IF signal input from the external device 14B into a digital signal based on the first clock output from the clock generating circuit 11 and the second clock output from the divider circuit 12B.

Effects of Third Embodiment

As described above, the signal processing circuit 1 according to the third embodiment includes the plurality of divider circuits 12, which generate the second clocks input to the plurality of respective AD converters 15, and the plurality of amplifiers 13, which are disposed between the clock generating circuit 11 and the plurality of respective divider circuits 12 and have the phase variation property opposite to the phase variation property of these divider circuits 12. This configuration allows the signal processing circuit 1 to meet a synchronization condition between the first clock and the second clock in the plurality of AD converters 15 regardless of the temperature variation while reducing an inclusion of noise in the second clock input to the plurality of respective AD converters 15.

While this disclosure has been described above using the embodiments, the technical scope of this disclosure is not limited to the scope described in the above-described embodiments, and various modifications and changes are possible within the scope of the gist. For example, in a specific embodiment of the distribution and integration of the device, this disclosure is not limited to the above-described embodiments and can be functionally or physically distributed and integrated in any unit for all or a part thereof. Additionally, a new embodiment created by any combination of the plurality of embodiments is also included in the embodiment of this disclosure. Effects of the new embodiment created by the combination also include the effects of the original embodiments.

The signal processing circuit may further include a plurality of the converters corresponding to a plurality of the respective input signals. The divider circuit may be configured to output the second clock to the plurality of respective converters.

The signal processing circuit may further include a plurality of the converters, a plurality of the divider circuits, and a plurality of the amplifiers. The plurality of converters correspond to a plurality of the respective input signals. The plurality of divider circuits are configured to generate the second clocks input to the plurality of respective converters. The plurality of the amplifiers are disposed between the clock generating circuit and the plurality of respective divider circuits. The plurality of amplifiers have phase variation properties opposite to phase variation properties of the plurality of divider circuits.

With the embodiments, an effect of ensuring meeting a synchronization condition between the first clock and the second clock regardless of a temperature variation is provided.

The principles, preferred embodiment and mode of operation of the present disclosure have been described in the foregoing specification. However, the disclosure which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present disclosure. Accordingly, it is expressly intended that all such variations, changes and equivalents which fall within the spirit and scope of the present disclosure as defined in the claims, be embraced thereby.

What is claimed is:
1. A signal processing circuit comprising:
    a clock generating circuit configured to output a first clock;
    a divider circuit configured to divide the first clock to output a second clock, the second clock having a frequency lower than a frequency of the first clock;

a converter configured to convert an input signal into a digital signal based on a first clock output from the clock generating circuit and a second clock output from the divider circuit; and an amplifier disposed between the clock generating circuit and the divider circuit, the amplifier having a phase variation property opposite to a phase variation property of the divider circuit, the phase variation property of the divider circuit indicating a relationship between a phase variation amount of an output signal with respect to an input signal in the divider circuit and an ambient temperature of the divider circuit.

2. The signal processing circuit according to claim 1, further comprising a plurality of the converters corresponding to a plurality of the respective input signals, wherein the divider circuit is configured to output the second clock to the plurality of respective converters.

3. The signal processing circuit according to claim 1, further comprising:

a plurality of the converters corresponding to a plurality of the respective input signals;

a plurality of the divider circuits configured to output the second clocks to the plurality of respective converters; and a plurality of the amplifiers disposed between the clock generating circuit and the plurality of respective divider circuits, the plurality of amplifiers having phase variation properties opposite to phase variation properties of the plurality of divider circuits.

* * * * *